United States Patent
Tsorng et al.

(10) Patent No.: US 12,016,148 B2
(45) Date of Patent: Jun. 18, 2024

(54) BRACKET ASSEMBLY FOR RISER BRACKET ASSEMBLY

(71) Applicant: Quanta Computer Inc., Taoyuan (TW)

(72) Inventors: Yaw-Tzorng Tsorng, Taoyuan (TW); Ming-Lung Wang, Taoyuan (TW); Hung-Wei Chen, Taoyuan (TW); Liang-Ju Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 81 days.

(21) Appl. No.: 17/986,154

(22) Filed: Nov. 14, 2022

(65) Prior Publication Data

US 2024/0164043 A1     May 16, 2024

(51) Int. Cl.
| | |
|---|---|
| *G06F 1/16* | (2006.01) |
| *H05K 5/00* | (2006.01) |
| *H05K 7/00* | (2006.01) |
| *H05K 7/14* | (2006.01) |

(52) U.S. Cl.
CPC ......... *H05K 7/1489* (2013.01); *H05K 7/1418* (2013.01)

(58) Field of Classification Search
CPC .. H05K 7/1489; H05K 7/1418; H05K 7/1488; H05K 7/1487; H05K 7/1485
See application file for complete search history.

(56) References Cited

U.S. PATENT DOCUMENTS

| | | | | |
|---|---|---|---|---|
| 5,495,389 | A | * | 2/1996 | Dewitt ...................... G06F 1/18 220/255 |
| 6,396,703 | B1 | * | 5/2002 | White ................ H01R 13/6335 439/157 |
| 7,070,431 | B1 | * | 7/2006 | White .................. H05K 7/1409 439/160 |
| 2005/0122703 | A1 | * | 6/2005 | Fan ....................... H05K 7/1408 361/801 |
| 2005/0152122 | A1 | * | 7/2005 | Fan ....................... H05K 7/1409 361/752 |
| 2014/0049901 | A1 | * | 2/2014 | Zhu ....................... H05K 7/1418 361/679.32 |
| 2014/0183317 | A1 | * | 7/2014 | Li ........................... G06F 1/186 248/316.7 |
| 2021/0365084 | A1 | * | 11/2021 | Chang .................. G06F 13/4004 |
| 2022/0057848 | A1 | * | 2/2022 | Chang .................. H05K 5/0265 |
| 2022/0272859 | A1 | * | 8/2022 | Zhang .................... H05K 1/141 |

* cited by examiner

*Primary Examiner* — Anthony M Haughton
(74) *Attorney, Agent, or Firm* — NIXON PEABODY LLP

(57) ABSTRACT

A swivel bracket assembly and a method for installing an electrical component to a riser bracket assembly are disclosed. The swivel bracket assembly includes a baseplate; a swivel bracket rotatably attached to the baseplate, the swivel bracket being rotatable between an open position and a closed position; and pads attached to the swivel bracket, at least one of the pads being configured to contact and support the electrical component attached to the riser bracket assembly when the swivel bracket is in the closed position. A method for installing an electrical component to a riser bracket assembly includes receiving the electrical component into a slot of a riser circuit board and pivoting a swivel bracket rotatable coupled to a baseplate from an open position to a closed position to support the electrical component secured to the riser bracket assembly.

20 Claims, 5 Drawing Sheets

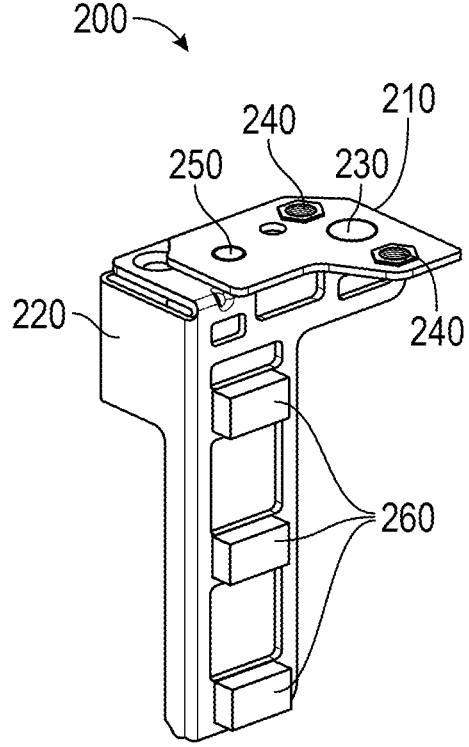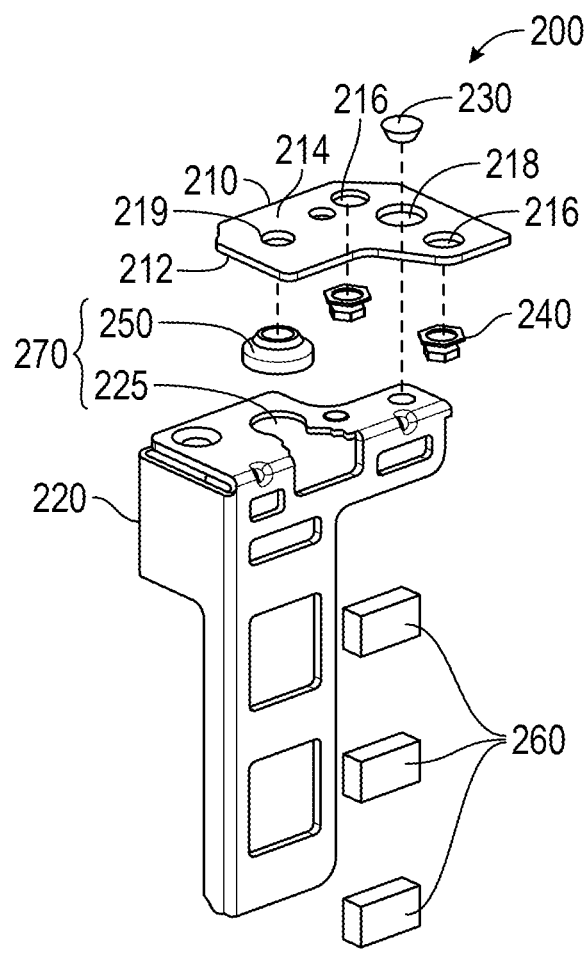
FIG. 4  FIG. 5
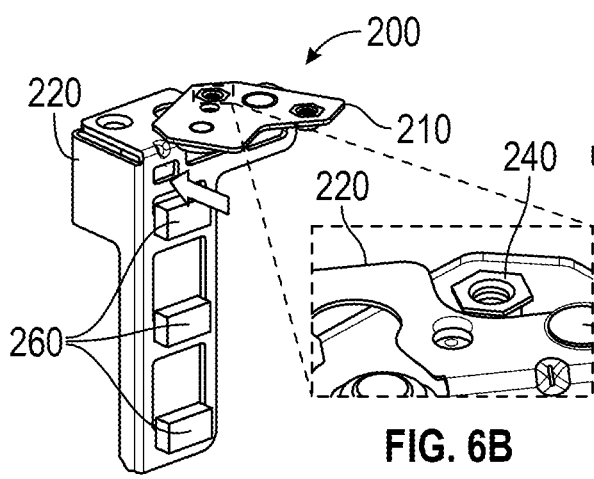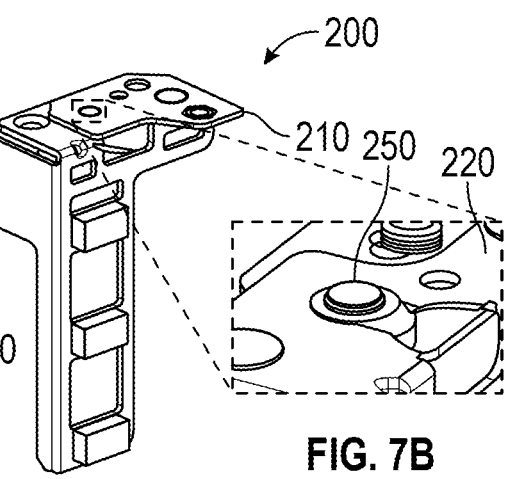
FIG. 6A  FIG. 6B  FIG. 7A  FIG. 7B

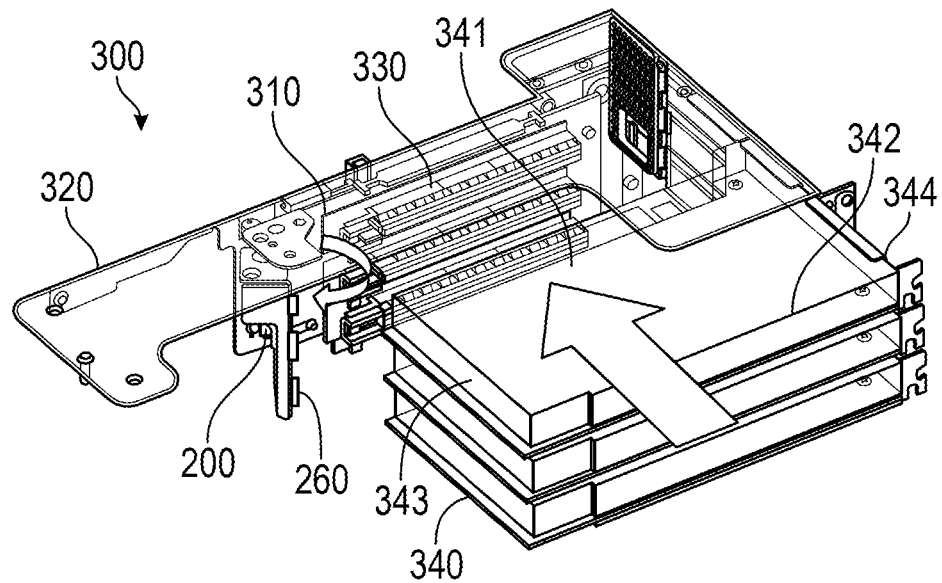
FIG. 9
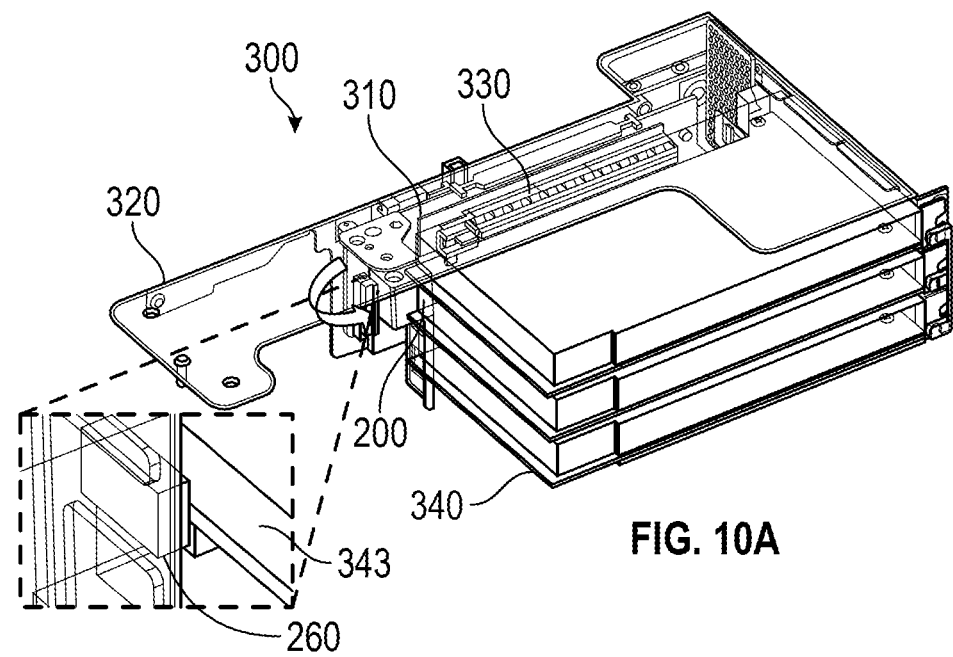
FIG. 10A
FIG. 10B

BRACKET ASSEMBLY FOR RISER BRACKET ASSEMBLY

FIELD OF THE INVENTION

The present invention relates generally to a swivel bracket assembly for securing an electrical component to a riser bracket assembly, and more specifically, to a riser bracket assembly for an electronic system.

BACKGROUND OF THE INVENTION

Servers are specialized computer systems that include numerous electrical components integrated into a single unit using a server chassis. Common to all servers is some form of a mother board including a central processing unit (CPU), slots for memory (e.g., DDR3, DDR4, DRAM), PCIe (Peripheral Computer Interconnect Express) slots, and connectors to other components, such as hard drives, a power supply, and peripherals (e.g., USB ports, LAN and other I/O ports).

PCIe is an industry-standard interface I/O and connectivity solution. PCIe is used to communicate with CPUs and the outside world of I/O networking electric components. In addition to providing attachment of traditional LAN, SAN, MAN, and WAN electric components, PCIe is also used for attaching expansion card modules (e.g., GPUs and video cards to servers).

Referring to FIGS. 1 and 2, conventionally, a PCIe riser module 100 includes a riser circuit board 110 mounted to a riser bracket 120. The riser circuit board 110 has one or more interfaces or slots 130 for attaching electrical components 140 such as one or more expansion card modules. When the electrical components 140 are attached to the riser circuit board 110, the riser module 100 can improve electrical connection between the riser circuit board 110 and the electrical components 140 by using a fastening mechanism that can limit movement of the attached electrical component 140. For example, the fastening mechanism includes a latch 150 (see magnified view 1 in FIG. 2) on the bracket 120, a bracket hole 160 (see magnified view 2 in FIG. 2), and/or other types of locking mechanism (see magnified view 3 in FIG. 2) in the slot 130 of the riser circuit board 110.

However, the above-described mechanisms are sometimes insufficient to ensure stable connection between the riser circuit board 110 and the electrical component 140. As exemplified in FIG. 3, an attached electrical component 140 tends to pivot and causes the interface of the electrical component 140 to eject from the slot 130 of the riser circuit board 110. For example, connection between the PCIe cards 140, as an example of the electrical component 140, and the slots 130 of the riser circuit board 110 may be loosened due to external impacts such as vibration or falling, causing electrical disconnection between electric components of the system.

Therefore, a need exists for riser bracket assemblies that provides a mechanism to strengthen securing of the expansion cards or PCIe cards installed in the bracket. A need also exists for bracket assemblies that prevents the expansion cards or PCIe cards from being separated from the riser circuit board due to poor contact between the expansion cards or PCIe cards and the riser circuit board.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In view of the above-described problem with conventional riser modules, the present application discloses a riser bracket assembly/module with a pivotable bracket assembly to alleviate the electrical connection problem due to movement of the expansion card and/or poor contact between interfaces of the expansion card and the riser circuit board.

According to certain aspects of the present disclosure, a swivel bracket assembly for securing an electrical component to a riser bracket assembly is disclosed. According to various embodiments, the swivel bracket assembly includes a baseplate having an inner surface and an outer surface, the outer surface being attachable to the riser bracket assembly; a swivel bracket rotatably attached to the inner surface of the baseplate, the swivel bracket being rotatable between an open position and a closed position; and one or more pads attached to the swivel bracket. At least one of the one or more pads is configured to contact and support the electrical component attached to the riser bracket assembly when the swivel bracket is in the closed position.

According to another aspect of the swivel bracket assembly, the swivel bracket assembly further includes a latch configured to lock the swivel bracket in the closed position relative to the baseplate. In some examples, the latch includes a concave space formed at the swivel bracket and an extendable pin protruding from the inner surface of the baseplate, the extendable pin being received in the concave space when the swivel bracket is in the closed position. In some examples, the extendable pin includes a spring spool.

In some examples, the one or more pads are made of a shock absorbing material or rubber, the one or more pads supporting the electrical component via frictional contact. In some examples, the electrical component includes an expansion card including a Peripheral Component Interconnect (PCI) Express (PCIe) card.

According to another aspect of the swivel bracket assembly, the swivel bracket assembly further includes a stop member protrudingly extending from the inner surface of the baseplate, the stop member being configured to stop movement of the swivel bracket when the swivel bracket is moved from the closed position to the open position. In some examples, the stop member includes a fastener coupled to the baseplate via a through hole formed on the baseplate. In some examples, the fastener is internally, externally, or both internally and externally threaded.

According to another aspect of the swivel bracket assembly, the swivel bracket extends perpendicularly from the inner surface of the baseplate, the one or more pads including a plurality of pads that are spaced apart from each other.

According to other aspects of the present disclosure, a riser bracket assembly is enclosed. According to various embodiments, the riser bracket assembly includes a riser circuit board including one or more slots for receiving one or more electrical components; and a swivel bracket assembly. The swivel bracket assembly includes a baseplate having an inner surface and an outer surface, the outer surface being attachable to an inner surface of the riser bracket assembly; a swivel bracket rotatably attached to the inner surface of the baseplate, the swivel bracket being rotatable between an open position and a closed position; one or more pads attached to the swivel bracket, at least one of the one or more pads being configured to contact and support the one or more electrical components received at the one or more slots when the swivel bracket is in the closed position.

According to another aspect of the riser bracket assembly described above, the one or more pads are not in contact with the one or more electrical components received at the one or more slots when the swivel bracket is in the open position.

According to another aspect of the riser bracket assembly described above, the one or more pads support the one or more electrical components via frictional contact when the swivel bracket is in the closed position such that the one or more electrical components are prevented from falling out of the one or more slots.

In some examples, a number of the one or more pads is same as a number of the one or more slots. In some examples, each of the one or more pads contacts a corresponding one of the one or more electrical components when the swivel bracket is in the closed position.

In some examples, the one or more electrical components comprise an expansion card including a Peripheral Component Interconnect (PCI) Express (PCIe) card. In some examples, the PCIe card has a first side that is inserted into one of the one or more slots, a second side that is parallel to the first side, a third side that is perpendicular to the first and second sides, and a fourth side that is parallel to the third side; and a corresponding one of the one or more pads contacts the third side of the PCIe card when the swivel bracket is in the closed position.

According to certain aspects of the present disclosure, a method for installing an electrical component to a riser bracket assembly is disclosed. According to various embodiments, the method includes providing a swivel bracket assembly, the swivel bracket assembly including a swivel bracket rotatably coupled to a baseplate and pivotable between an open position and a closed position; receiving the electrical component into a slot of a riser circuit board, the slot being accessible in the riser bracket assembly when the swivel bracket is in the open position; and pivoting the swivel bracket from the open position to the closed position after receiving the electrical component in the slot, the pivoting of the swivel bracket causing a pad of the swivel bracket to make contact with and support the electrical component secured to the riser bracket assembly.

In some examples, the electrical component includes an expansion card including a Peripheral Component Interconnect (PCI) Express (PCIe) card. In some examples, the pad is made of a shock absorbing material or rubber. In some examples, the baseplate is fixedly coupled to the riser bracket assembly.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 4 is a perspective view of a swivel bracket assembly, according to certain aspects of the present disclosure.

FIG. 5 is an exploded view of the swivel bracket assembly shown in FIG. 4, according to certain aspects of the present disclosure.

FIG. 6A is a perspective view of a swivel bracket assembly in an open position, according to certain aspects of the present disclosure.

FIG. 6B is a magnified view of a portion of the swivel bracket assembly shown in FIG. 6A, according to certain aspects of the present disclosure.

FIG. 7A is a perspective view of the swivel bracket assembly of FIG. 6A in a closed position, according to certain aspects of the present disclosure.

FIG. 7B is a magnified view of a portion of the swivel bracket assembly shown in FIG. 7A, according to certain aspects of the present disclosure.

FIG. 9 is a perspective view of the riser bracket assembly shown in FIG. 8 with a swivel bracket assembly in an open position, PCIe cards being inserted thereto, according to certain aspects of the present disclosure.

FIG. 10A is a perspective view of the riser bracket assembly shown in FIGS. 8 and 9 with the PCIe cards inserted therein, the swivel bracket assembly being closed, according to certain aspects of the present disclosure.

FIG. 10B is a magnified view of a portion of the swivel bracket assembly shown in FIG. 10A, according to certain aspects of the present disclosure.

Figure 1:
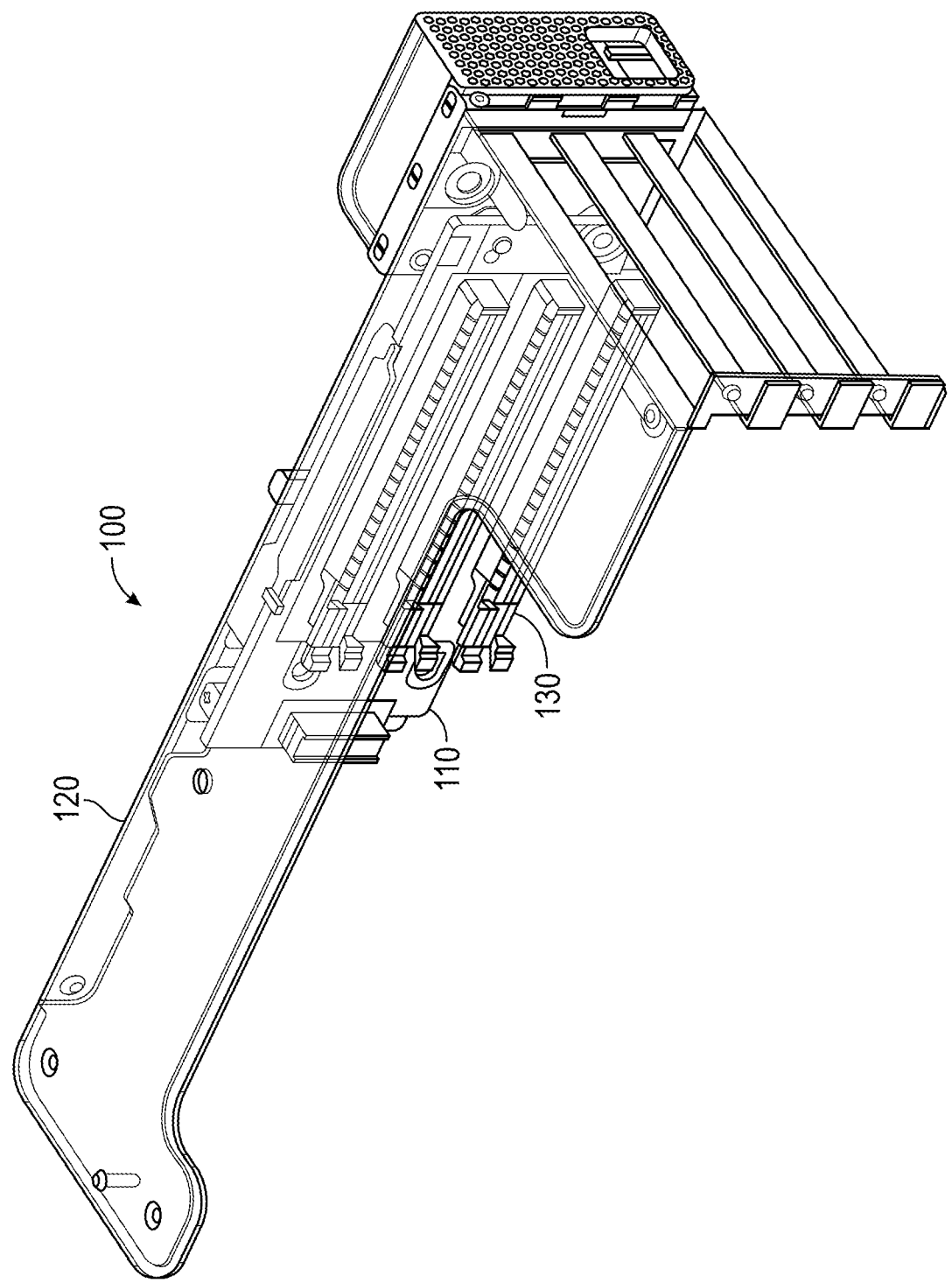
FIG. 1 is a perspective view of a prior art riser module.

Elements in the figures are illustrated for simplicity and clarity and have not necessarily been drawn to scale. For example, the dimensions and/or relative positioning of some of the elements in the figures may be exaggerated relative to other elements to help improve understanding of various features.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

A swivel bracket assembly 200 according to various embodiments of the present invention is shown in FIGS. 4 and 5. The swivel bracket assembly 200 is for securing an electrical component 340 to a riser bracket assembly 300. For example, the electrical component 340 includes an expansion card including a Peripheral Component Interconnect (PCI) Express (PCIe) card.

According to various embodiments of the present invention, the swivel bracket assembly 200 includes a baseplate 210 and a swivel bracket 220. The baseplate 210 has an inner surface 212 (lower surface, not actually shown in the drawings) and an outer surface 214 (upper surface). The outer surface 214 of the baseplate 210 is attachable to a bracket 320 of the riser bracket assembly 300 shown in FIG. 8. For example, at least one through hole 216 is formed on the baseplate 210, as shown in FIG. 5. In some embodiments, the baseplate 210 is fixed to the bracket 320 by at least one fastener 240. In FIGS. 4 and 5, although two fasteners 240 are shown, the number of the fastener(s) is not limited thereto, and the number may be 1 or more than 2. For example, the at least one fastener 240 is a nut. As discussed below, the at least one fastener 240 may also be used as a stopper for limiting movement of the swivel bracket 220.

The swivel bracket 220 is rotatably attached to the inner surface 212 of the baseplate 210. The swivel bracket 220 is rotatable between an open position shown in FIG. 6A and a closed position shown in FIG. 7A. For example, the swivel bracket 220 and the baseplate 210 are coupled via a hinge 230, as exemplified in FIGS. 4 and 5. In some embodiments, the hinge 230 passes through a hole 218 formed on the baseplate 210 and is coupled to the swivel bracket 220.

Referring to FIGS. 4 and 5, one or more pads 260 are attached to the swivel bracket 220. At least one of the one or more pads 260 is configured to contact and support the electrical component 340 attached to the riser bracket assembly 300 when the swivel bracket 220 is in the closed position, as shown in FIGS. 10A and 10B. In some embodiments, the one or more pads 260 are made of a shock absorbing material or rubber. Thus, the one or more pads 260 can support the electrical component 340 via frictional contact.

In some embodiments, the swivel bracket assembly 200 further includes a latch 270 configured to lock the swivel bracket 220 in the closed position relative to the baseplate 210. For example, the latch 270 includes a concave space 225 formed at the swivel bracket 220, as shown in FIG. 5. The latch 270 further includes an extendable pin 250 protruding from the inner surface 212 of the baseplate 210. The extendable pin 250 is received in the concave space 225 when the swivel bracket 220 is in the closed position, as shown in FIG. 7B. Thus, an external force may need to be applied to the swivel bracket 220 to disengage the extendable pin 250 from the concave space 225. For example, the extendable pin 250 includes a spring spool. In some embodiments, the extendible pin 250 is inserted into a hole 219 formed on the baseplate 210.

In some embodiments, the swivel bracket assembly 200 further includes a stop member/fastener 240 protrudingly extending from the inner surface 212 of the baseplate 210. That is, the fastener 240 described above is also used as a stop member. In some embodiments, the stop member/fastener 240 is configured to stop movement of the swivel bracket 220 when the swivel bracket is moved from the closed position to the open position, as shown in FIG. 6B. Thus, the maximum opening angle of the swivel bracket 220 is set by the stop member 240. As discussed above, in some embodiments, the stop member/fastener 240 is coupled to the baseplate 210 via a through hole 216 formed on the baseplate 210. In some embodiments, the stop member/fastener 240 is internally, externally, or both internally and externally threaded. See FIGS. 5 and 6B.

Referring to FIGS. 4 and 5, the swivel bracket 220 extends perpendicularly from the inner surface 212 of the baseplate 210. In some embodiments, the one or more pads 260 includes a plurality of pads that are spaced apart from each other. For example, 3 pads 260 are shown in FIGS. 4 and 5. However, the number of the pads 260 is not limited thereto and the number may be less or more than 3.

Figure 2:
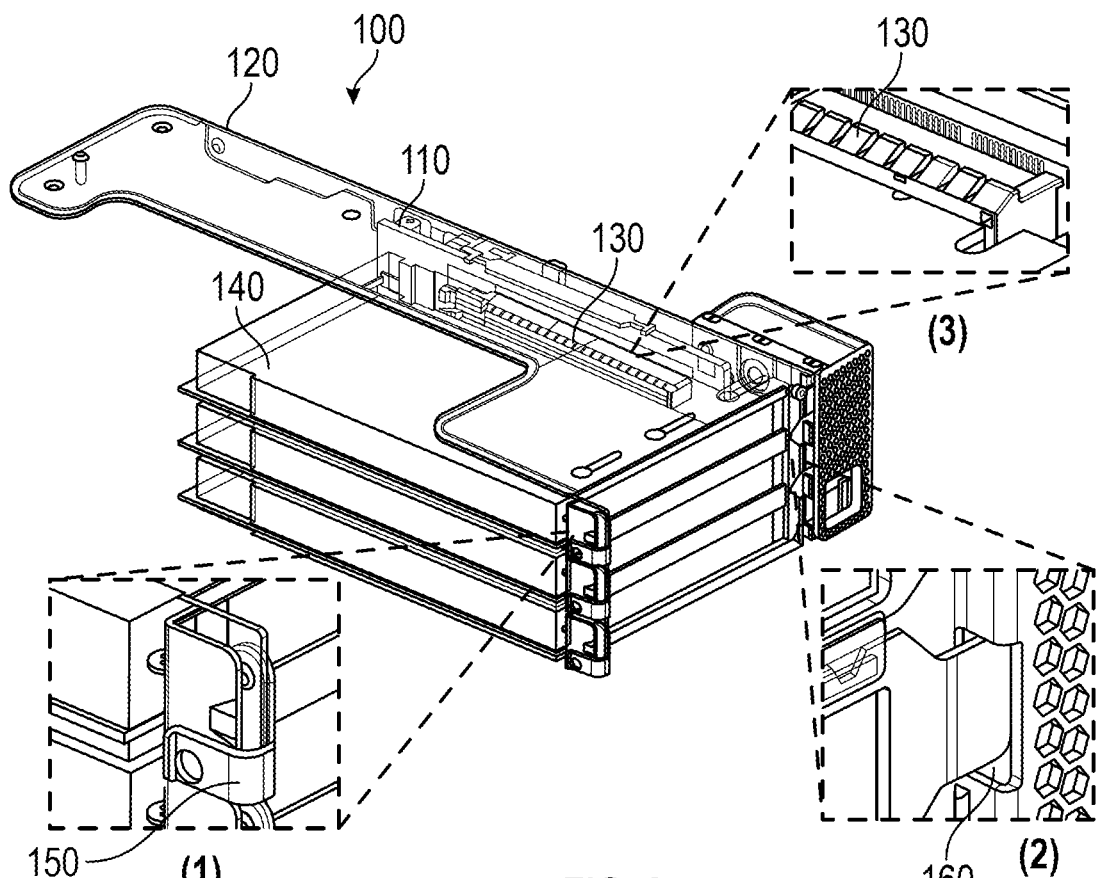
FIG. 2 is a perspective view of the prior art riser module shown in FIG. 1 with PCIe cards coupled to interfaces of a riser circuit board.
Figure 3:
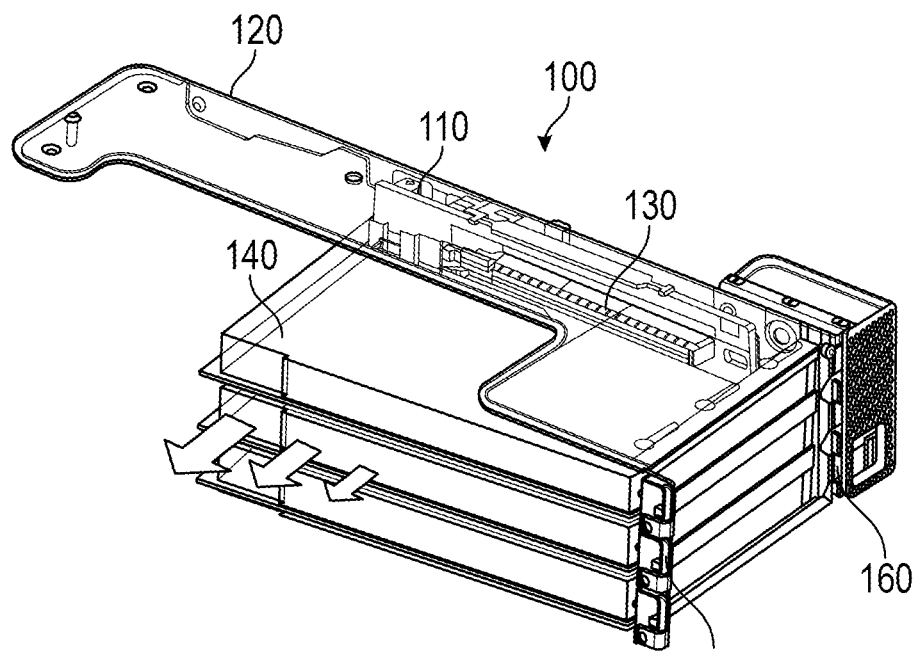
FIG. 3 is a perspective view of the prior art riser module shown in FIGS. 1 and 2, exemplifying loosening connection between the PCIe cards and the interfaces of the riser circuit board.
Figure 8:
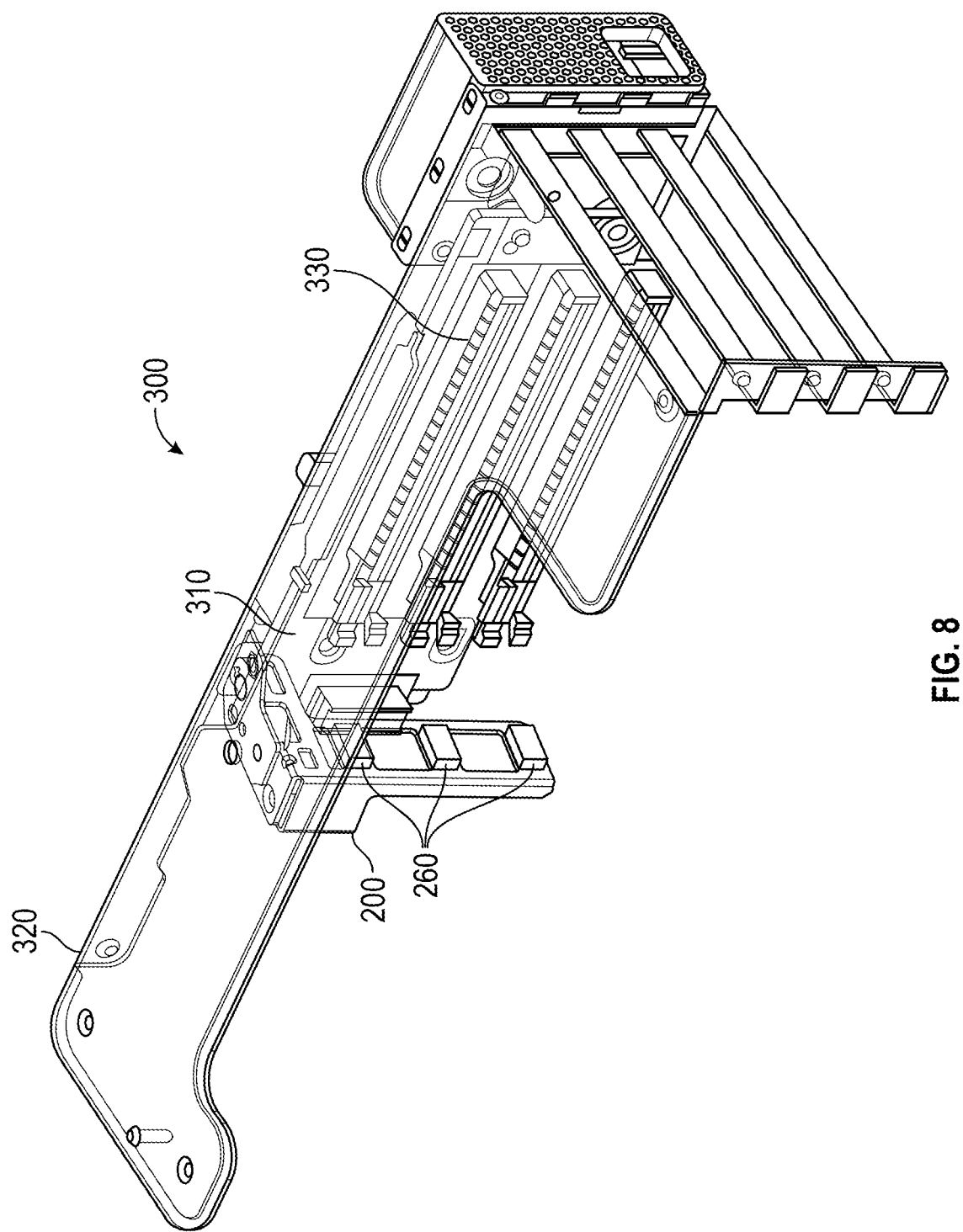
FIG. 8 is a perspective view of a riser bracket assembly, according to certain aspects of the present disclosure.

A riser bracket assembly 300 according to various embodiments of the present invention is shown in FIG. 8. Referring to FIG. 8, the riser bracket assembly 300 includes a frame or bracket 320. A riser circuit board 310 is attached to the bracket 320. The riser circuit board 310 includes one or more slots 330 for receiving one or more electrical components 340. The riser bracket assembly 300 may also include the various fastening mechanisms discussed above with regard to the prior art PCIe riser module 100, referring to FIG. 2.

The riser bracket assembly 300 further includes a swivel bracket assembly 200, shown in FIGS. 4 and 5, attached to the bracket 320. In some embodiments, the riser bracket assembly 300 according to various embodiments of the present invention includes the swivel bracket assembly 200 in addition to the various fastening mechanisms also included in the prior art PCIe riser module 100 discussed above.

According to various embodiments of the present invention, the swivel bracket assembly 200 includes a baseplate 210 having an inner surface 212 and an outer surface 214. As shown in FIG. 8, the outer surface 214 of the baseplate 210 is attached to an inner surface of the bracket 320 or riser bracket assembly 300.

The swivel bracket assembly 200 further includes a swivel bracket 220 rotatably attached to the inner surface 212 of the baseplate 210. Referring to FIGS. 6A and 7A, the swivel bracket 220 is rotatable between an open position and a closed position. The baseplate 210 is fixed and only the swivel bracket 220 is rotated. Directions of the rotation of the swivel bracket 220 is shown in FIGS. 6A and 7A, the swivel bracket 220 moving away from the baseplate 210 and moving toward the baseplate 210, respectively.

As shown in FIGS. 4 and 5, one or more pads 260 are attached to the swivel bracket 220. As shown in FIGS. 10A and 10B, at least one of the one or more pads 260 is configured to contact and support the one or more electrical components 340 received at the one or more slots 330 when the swivel bracket 220 is in the closed position. As shown in FIG. 9, the one or more pads 260 are not in contact with the one or more electrical components 340 received at the one or more slots 330 when the swivel bracket 220 is in the open position. The one or more pads 260 support the one or more electrical components 340 via frictional contact when the swivel bracket 220 is in the closed position, as shown in FIG. 10B. Thus, the one or more electrical components 340 are prevented from falling out of the one or more slots 330 when the swivel bracket 220 is in the closed position.

In some embodiments, a number of the one or more pads 260 is same as a number of the one or more slots 330. Thus, each of the one or more pads 260 contacts a corresponding one of the one or more electrical components 340 when the swivel bracket 220 is in the closed position.

In FIGS. 8 and 9, the numbers of both the pads 260 and slots 330 are 3. However, the number of each of the pads 260 and slots 330 may be less or more than 3.

For example, the one or more electrical components 340 include an expansion card such as a Peripheral Component Interconnect (PCI) Express (PCIe) card. Referring to FIG. 9, the PCIe card 340 has a first side 341 that is inserted into one of the one or more slots 330, a second side 342 that is parallel to the first side 341, a third side 343 that is perpendicular to the first and second sides 341, 342, and a fourth side 344 that is parallel to the third side 343. Referring to FIGS. 10A and 10B, a corresponding one of the one or more pads 260 contacts the third side 343 of the PCIe card 340 when the swivel bracket 220 is in the closed position.

According to various embodiments of the present invention, a method for installing an electrical component 340 to a riser bracket assembly 300 includes providing a swivel bracket assembly 200. As discussed above, the swivel bracket assembly 200 includes a swivel bracket 220 rotatably coupled to a baseplate 210. The swivel bracket 220 is pivotable between an open position and a closed position, as shown in FIGS. 6A, 7A, 9, and 10A.

The method further includes receiving the electrical component 340 into a slot 330 of a riser circuit board 310. As shown in FIG. 9, the slot 330 is accessible in the riser bracket assembly 300 when the swivel bracket 220 is in the open position. The method further includes pivoting the swivel bracket 220 from the open position to the closed position after receiving the electrical component 340 in the slot 330, as shown in FIG. 10A. The pivoting of the swivel bracket 220 causes a pad 260 of the swivel bracket 220 to make contact with and support the electrical component 340 secured to the riser bracket assembly 300.

In the method, for example, the electrical component 340 is an expansion card including a Peripheral Component Interconnect (PCI) Express (PCIe) card. In further examples, the pad 260 is made of a shock absorbing material or rubber. While the swivel bracket 220 is rotatable with respect to the baseplate 210, the baseplate 210 is fixedly coupled to the riser bracket assembly 300.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A swivel bracket assembly for securing an electrical component to a riser bracket assembly, the swivel bracket assembly comprising:
   a baseplate having an inner surface and an outer surface, the outer surface being attachable to the riser bracket assembly;
   a swivel bracket rotatably attached to the inner surface of the baseplate, the swivel bracket being rotatable between an open position and a closed position; and
   one or more pads attached to the swivel bracket, at least one of the one or more pads being configured to contact and support the electrical component attached to the riser bracket assembly when the swivel bracket is in the closed position.

2. The swivel bracket assembly of claim 1, further comprising a latch configured to lock the swivel bracket in the closed position relative to the baseplate.

3. The swivel bracket assembly of claim 2, wherein the latch includes:
a concave space formed at the swivel bracket; and
an extendable pin protruding from the inner surface of the baseplate, the extendable pin being received in the concave space when the swivel bracket is in the closed position.

4. The swivel bracket assembly of claim 3, wherein the extendable pin includes a spring spool.

5. The swivel bracket assembly of claim 1, wherein the one or more pads are made of a shock absorbing material or rubber, the one or more pads supporting the electrical component via frictional contact.

6. The swivel bracket assembly of claim 1, further comprising a stop member protrudingly extending from the inner surface of the baseplate, the stop member being configured to stop movement of the swivel bracket when the swivel bracket is moved from the closed position to the open position.

7. The swivel bracket assembly of claim 6, wherein the stop member includes a fastener coupled to the baseplate via a through hole formed on the baseplate.

8. The swivel bracket assembly of claim 7, wherein the fastener is internally, externally, or both internally and externally threaded.

9. The swivel bracket assembly of claim 1, wherein the electrical component comprises an expansion card including a Peripheral Component Interconnect (PCI) Express (PCIe) card.

10. The swivel bracket assembly of claim 1, wherein the swivel bracket extends perpendicularly from the inner surface of the baseplate, the one or more pads including a plurality of pads that are spaced apart from each other.

11. A riser bracket assembly comprising:
a riser circuit board including one or more slots for receiving one or more electrical components; and
a swivel bracket assembly,
wherein the swivel bracket assembly comprises:
a baseplate having an inner surface and an outer surface, the outer surface being attachable to an inner surface of the riser bracket assembly;
a swivel bracket rotatably attached to the inner surface of the baseplate, the swivel bracket being rotatable between an open position and a closed position; and
one or more pads attached to the swivel bracket, at least one of the one or more pads being configured to contact and support the one or more electrical components received at the one or more slots when the swivel bracket is in the closed position.

12. The riser bracket assembly of claim 11, wherein the one or more pads are not in contact with the one or more electrical components received at the one or more slots when the swivel bracket is in the open position.

13. The riser bracket assembly of claim 11, wherein the one or more pads support the one or more electrical components via frictional contact when the swivel bracket is in the closed position such that the one or more electrical components are prevented from falling out of the one or more slots.

14. The riser bracket assembly of claim 11, wherein a number of the one or more pads is same as a number of the one or more slots.

15. The riser bracket assembly of claim 14, wherein each of the one or more pads contacts a corresponding one of the one or more electrical components when the swivel bracket is in the closed position.

16. The riser bracket assembly of claim 11, wherein the one or more electrical components comprise an expansion card including a Peripheral Component Interconnect (PCI) Express (PCIe) card.

17. The riser bracket assembly of claim 16, wherein:
the PCIe card has a first side that is inserted into one of the one or more slots, a second side that is parallel to the first side, a third side that is perpendicular to the first and second sides, and a fourth side that is parallel to the third side; and
a corresponding one of the one or more pads contacts the third side of the PCIe card when the swivel bracket is in the closed position.

18. A method for installing an electrical component to a riser bracket assembly, the method comprising:
providing a swivel bracket assembly, the swivel bracket assembly including a swivel bracket rotatably coupled to a baseplate and pivotable between an open position and a closed position;
receiving the electrical component into a slot of a riser circuit board, the slot being accessible in the riser bracket assembly when the swivel bracket is in the open position; and
pivoting the swivel bracket from the open position to the closed position after receiving the electrical component in the slot, the pivoting of the swivel bracket causing a pad of the swivel bracket to make contact with and support the electrical component secured to the riser bracket assembly.

19. The method of claim 18, wherein:
the electrical component comprises an expansion card including a Peripheral Component Interconnect (PCI) Express (PCIe) card; and
the pad is made of a shock absorbing material or rubber.

20. The riser module of claim 18, wherein the baseplate is fixedly coupled to the riser bracket assembly.

* * * * *